(12) United States Patent
Takahashi et al.

(10) Patent No.: US 8,642,958 B2
(45) Date of Patent: Feb. 4, 2014

(54) COMPOSITE CHARGED PARTICLE BEAM APPARATUS AND SAMPLE PROCESSING AND OBSERVING METHOD

(75) Inventors: Haruo Takahashi, Chiba (JP); Masakatsu Hasuda, Chiba (JP)

(73) Assignee: SII NanoTechnology Inc. (JP)

( * ) Notice: Subject to any disclaimer, the term of this patent is extended or adjusted under 35 U.S.C. 154(b) by 204 days.

(21) Appl. No.: 13/065,237

(22) Filed: Mar. 17, 2011

(65) Prior Publication Data
US 2011/0226947 A1 Sep. 22, 2011

(30) Foreign Application Priority Data

Mar. 18, 2010 (JP) ................................. 2010-063339
Jan. 18, 2011 (JP) ................................. 2011-008183

(51) Int. Cl.
*H01J 37/20* (2006.01)
(52) U.S. Cl.
CPC ..................................... *H01J 37/20* (2013.01)
USPC ....................... 250/310; 250/309; 250/442.11
(58) Field of Classification Search
USPC ...................................... 250/492.21, 310, 309
See application file for complete search history.

(56) References Cited

U.S. PATENT DOCUMENTS

| | | | | |
|---|---|---|---|---|
| 5,986,264 A * | 11/1999 | Grunewald | | 250/310 |
| 7,612,337 B2 * | 11/2009 | Suzuki et al. | | 250/310 |
| 7,626,165 B2 * | 12/2009 | Iwasaki | | 250/310 |
| 2005/0236587 A1 * | 10/2005 | Kodama et al. | | 250/492.21 |
| 2006/0097166 A1 * | 5/2006 | Ishitani et al. | | 250/310 |
| 2008/0258056 A1 * | 10/2008 | Zaykova-Feldman et al. | | 250/307 |
| 2008/0315088 A1 * | 12/2008 | Takahashi et al. | | 250/306 |
| 2011/0297827 A1 * | 12/2011 | Asai et al. | | 250/310 |

OTHER PUBLICATIONS

Abstract, publication No. JP04-076437, publication date Mar. 11, 1992.

* cited by examiner

*Primary Examiner* — Jack Berman
*Assistant Examiner* — Eliza Osenbaugh-Stewart
(74) *Attorney, Agent, or Firm* — Adams & Wilks

(57) ABSTRACT

There is provided a composite charged particle beam apparatus, in which a first rotation axis of a rotatable stage intersects a beam irradiation axis of a FIB column and a beam irradiation axis of an SEM so as to be substantially perpendicular thereto, respectively, at a sample observing position, the rotatable stage is provided with a supporting member which can be rotated with respect to the first rotation axis, and the supporting member is connected to a movement mechanism which can dispose the sample at the sample observing position.

11 Claims, 14 Drawing Sheets

Related art

COMPOSITE CHARGED PARTICLE BEAM APPARATUS AND SAMPLE PROCESSING AND OBSERVING METHOD

BACKGROUND OF THE INVENTION

1. Field of the Invention

The present invention relates to a composite charged particle beam apparatus which integrates a plurality of charged particle beam columns, and a sample processing and observing method.

2. Background Art

In order to obtain useful knowledge from observation using a transmission electron microscope (TEM), it is necessary to process a sample which is an observed object to form a very thin lamella (a TEM lamella) which has the thickness of about several tens of nanometers. In order to form such a lamella, a plurality of methods is used, and, among them, a method of using a focused ion beam (FIB) apparatus is typically widely used. The TEM lamella necessarily has a thin portion which is thin enough for the electron beam to be transmitted or thinner, but is preferably as thin over as wide a range as possible. For this reason, when the TEM lamella is formed using the FIB apparatus, there is a need to process the rear surface and the front surface of the lamella in parallel. In addition, in addition to a case where a uniform material is observed using the TEM, in a case where defects, foreign material, a specific local structure, or the like is desired to be observed, there is a need to form a lamella with a thickness of several tens of nanometers while leaving the observed object inside the lamella.

In order to treat these needs, an example is disclosed in which a lamella which is a processed object is easily observed by combining a scanning electron microscope (SEM) and the FIB and a lamella having a high parallelism can be processed by tilting the sample lamella (for example, refer to JP-A-H4-76437).

However, in the disclosed example, since it is necessary to secure a space for installing a sample and a stage mechanism for placing and moving the sample, the SEM and the FIB are disposed with a pinching angle smaller than 90 degrees and the SEM and the FIB are disposed further to the upper side than the surface of the sample. In the case of such a disposition, a size of the sample or the degree of freedom of the disposition is secured, whereas, as shown in FIG. 14, a distance (working distance) between the SEM and the sample cannot be reduced by fixed amount or more. Typically, a high performance SEM column is increased in characteristics including resolution and enables finer observations as the working distance becomes shorter. An improvement in observation capability is essential for forming a highly-sophisticated TEM sample, and thus there is a demand for methods for reducing the working distance of the SEM. Also, in JP-A-H4-76437, a method for forming a lamella having a high parallelism by tilting the sample is disclosed, but a specific mechanism for efficiently and accurately tilting a sample in an actual apparatus configuration is not disclosed.

SUMMARY OF THE INVENTION

The present invention provides an apparatus capable of improving capability in a TEM lamella observation and also efficiently controlling disposition and orientation of a sample by reducing the working distance between it and an SEM.

According to an embodiment of the present invention, there is provided a composite charged particle beam apparatus including a focused ion beam column; a scanning electron microscope; and a rotatable stage, wherein the beam irradiation axis of the focused ion beam column and the beam irradiation axis of the scanning electron microscope intersect each other so as to be substantially perpendicular to each other, wherein the rotatable stage is provided with a supporting member having a rotation axis which intersects the beam irradiation axis of the focused ion beam column and the beam irradiation axis of the scanning electron microscope so as to be substantially perpendicular thereto, respectively, at a sample observing position, and wherein the supporting member is connected to a movement mechanism which can dispose the sample at the sample observing position.

In the composite charged particle beam apparatus, the movement mechanism may have three driving axes which are substantially perpendicular to each other, and one of the driving axes may be disposed in a direction which is substantially parallel to the beam irradiation axis of the focused ion beam column by rotation of the supporting member.

Also, in the composite charged particle beam apparatus, the movement mechanism may include a sample rotation mechanism having a rotation axis substantially perpendicular to the first rotation axis of the rotatable stage.

In addition, the composite charged particle beam apparatus may further include a tilt stage that is connected to the sample rotation mechanism and can tilt the surface of the sample so as to be substantially perpendicular to the beam irradiation axis of the scanning electron microscope.

In addition, the composite charged particle beam apparatus may further include a tilt stage that is connected to the sample rotation mechanism and can tilt the surface of the sample so as to be substantially perpendicular to the beam irradiation axis of the focused ion beam column.

In addition, the composite charged particle beam apparatus may further include a tilt stage that is connected to the sample rotation mechanism and can tilt the surface of the sample so as to be substantially perpendicular to the beam irradiation axis of the focused ion beam column and the beam irradiation axis of the scanning electron microscope, respectively.

In the composite charged particle beam apparatus, the surface of the sample fixed to the tilt stage may be rotated using the sample rotation mechanism, and the surface of the sample can be tilted so as to be substantially perpendicular to the beam irradiation axis of the focused ion beam column and the beam irradiation axis of the scanning electron microscope, respectively.

In addition, the composite charged particle beam apparatus may further include a transmitted electron detector which can detect transmitted electrons when the scanning electron microscope irradiates the sample with an electron beam.

According to an embodiment of the present invention, there is provided a sample processing and observing method including the steps of disposing the surface of a sample so as to be substantially perpendicular to the beam irradiation axis of a scanning electron microscope and observing the surface using a scanning electron microscope; rotating the sample such that the surface is substantially perpendicular to the beam irradiation axis of a focused ion beam column which intersects the beam irradiation axis of the scanning electron microscope so as to be substantially perpendicular thereto, and processing the surface by irradiating a focused ion beam to the surface.

In the sample processing and observing method, a cross-section may be formed by processing the surface, and the method may further include rotating the sample such that the cross-section is substantially perpendicular to the beam irradiation axis of the focused ion beam column; and irradiating the focused ion beam to the cross-section and observing the cross-section.

According to another embodiment of the present invention, there is provided a sample processing and observing method including disposing the surface of a sample so as to be substantially perpendicular to the beam irradiation axis of a focused ion beam column and forming a cross-section in the sample using a focused ion beam; rotating the sample such that the cross-section is substantially perpendicular to the beam irradiation axis of the focused ion beam column; and irradiating the focused ion beam to the cross-section and forming a cross-section which is substantially perpendicular to the cross-section.

According to still another embodiment of the present invention, there is provided a sample processing and observing method including irradiating a focused ion beam to a sample and forming an observed surface; rotating the observed surface such that the observed surface is substantially perpendicular to the beam irradiation axis of a scanning electron microscope; and irradiating an electron beam from the scanning electron microscope to the observed surface and observing transmitted electrons which are transmitted through the observed surface.

According to another embodiment of the present invention, there is provided a composite charged particle beam apparatus including a focused ion beam column; a scanning electron microscope; and a rotatable stage, wherein the rotatable stage is provided with a supporting member having a rotation axis which intersects the beam irradiation axis of the focused ion beam column and the beam irradiation axis of the scanning electron microscope so as to be substantially perpendicular thereto, respectively, at a sample observing position, wherein the supporting member is connected to a movement mechanism which can dispose the sample at the sample observing position, wherein the movement mechanism includes a sample rotation mechanism having a rotation axis substantially perpendicular to the rotation axis of the rotatable stage, and wherein the sample rotation mechanism is connected to a tilt stage which can tilt the surface of the sample so as to be substantially perpendicular to the beam irradiation axis of the scanning electron microscope.

According to the present invention, it is possible to form a TEM lamella with good accuracy since a highly fine observation is made in a state of reducing the working distance of an SEM and an FIB process can be performed by controlling the tilt of a sample.

DETAILED DESCRIPTION OF THE INVENTION

Hereinafter, embodiments of the present invention will be described with reference to the accompanying drawings. In addition, the description of the embodiments is only an example, and a configuration of the present invention is not limited to the following description.

First Embodiment

Figure 1:
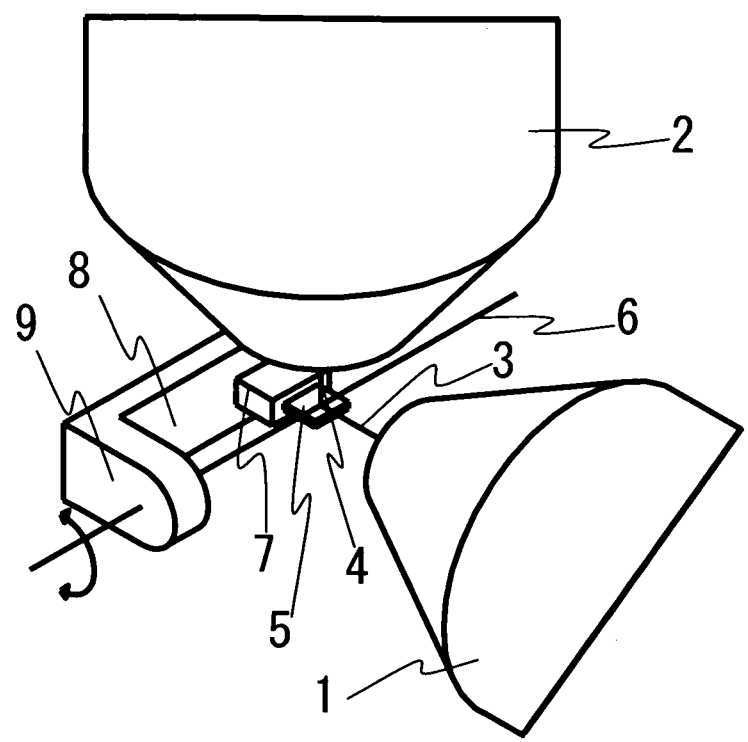
FIG. 1 is a diagram illustrating an apparatus configuration according to a first embodiment of the present invention.
Figure 2:
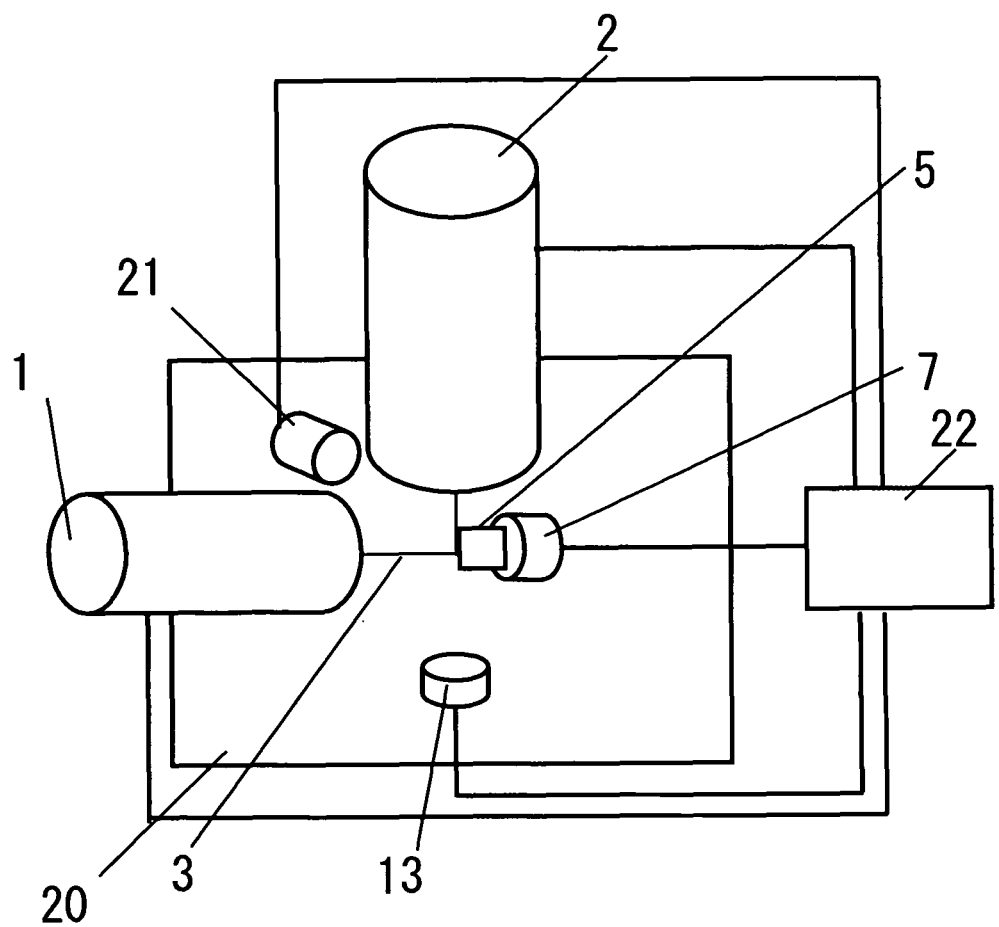
FIG. 2 is a diagram illustrating an apparatus configuration according to the first embodiment of the present invention.

A first embodiment of the present invention will be described with reference to the accompanying drawings. FIGS. 1 and 2 are diagrams illustrating a composite charged particle beam apparatus according to the first embodiment of the present invention. An SEM column 2 is installed vertically. An electron beam 4 is emitted from the SEM column 2 to a sample 5 positioned in a sample chamber 20 and scans the surface of the sample 5, secondary electrons generated are detected by a secondary electron detector 21, and an image forming unit 22 generates an observed image for the sample surface by using an amount of the secondary electrons at each position as a luminance signal. Here, the SEM column 2 has an in-lens detector therein, and can detect secondary electrons or reflected electrons.

An FIB column 1 is installed horizontally. Thereby, the beam irradiation axis of the SEM column 2 and the beam irradiation axis of the FIB column 1 are disposed substantially perpendicular to each other. A focused ion beam 3 is emitted from the FIB column 1 to the sample 5, the surface of the sample 5, that is, the surface facing the SEM column 2 is removed by an ion beam etching process, and thus the thickness of the sample 5 can be gradually decreased.

Figure 5:
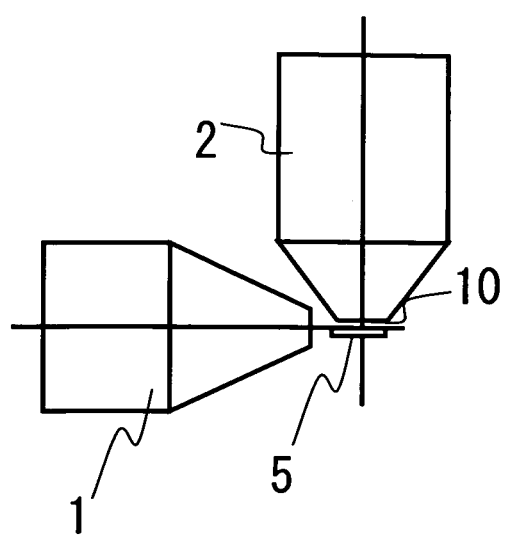
FIG. 5 is a diagram illustrating an apparatus configuration according to an embodiment of the present invention.
Figure 6:
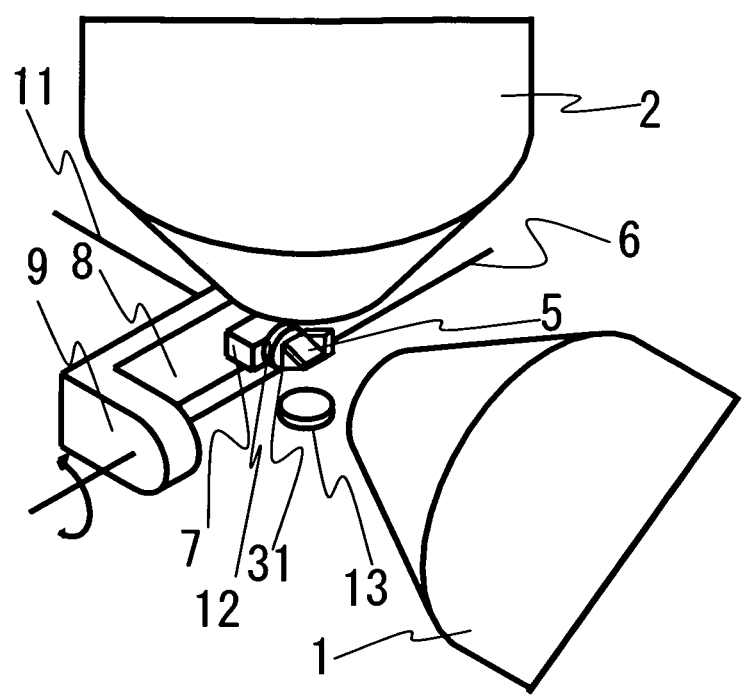
FIG. 6 is a diagram illustrating an apparatus configuration according to a fourth embodiment of the present invention.
Figure 14:
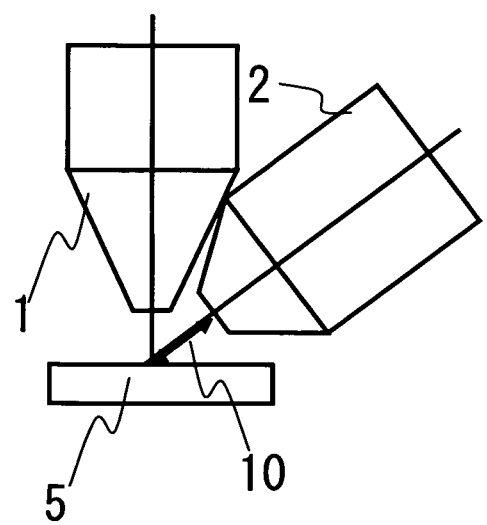
FIG. 14 is a diagram illustrating an example in the related art.

As can be clearly seen from the comparison of FIG. 14 illustrating the disposition according to the method in the related art with FIG. 5 illustrating the disposition according to an embodiment of the present invention, the working distance 10 of the SEM column 2 can be greatly reduced. Due to the short working distance 10 in this way, resolution of the SEM or detection efficiency of the in-lens detector is improved, and highly fine observed image can be obtained, as compared to when the working distance 10 is long.

Figure 4A:
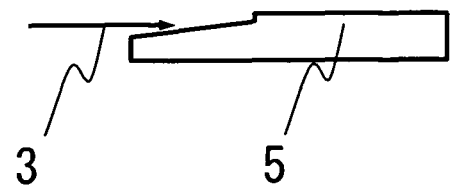
FIGS. 4A and 4B are diagrams illustrating a sample process according to an embodiment of the present invention.
Figure 4B:
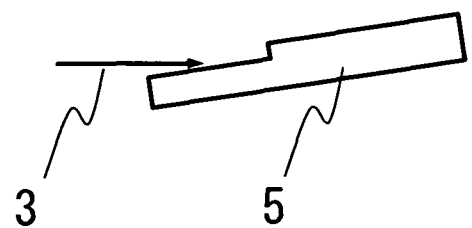

When the surface of the sample 5 is carved using the focused ion beam 3, the processed surface has a tapered shape as shown in FIG. 4A and thus is not strictly parallel to the focused ion beam 3. Therefore, in order to prevent the shape from becoming tapered, as shown in FIG. 4B, it is necessary to process the sample 5 in a state of tilting the sample 5 by an amount corresponding to the tapered angle. For this reason, a mechanism for tilting the sample 5 in the state shown in FIG. 4B is required.

Hereinafter, the mechanism for tilting will be described in detail. First, as a fundamental configuration, a first rotation axis 6 for tilting is disposed so as to pass through the intersection of the beam irradiation axis of the FIB column 1 and the beam irradiation axis of the SEM column 2 and perpendicular to both the FIB column 1 and the SEM column 2.

As a configuration of the sample stage, for example, the first rotation axis 6 may be positioned so as to minimize the rotation moment for the entire stage. However, in the state where the working distance 10 of the sample 5 with respect to the SEM column 2, there is a possibility of the sample 5 and the SEM column 2 coming into contact with each other, and thus a movement track of the sample 5 accompanying the tilt is preferably minimized.

Therefore, as described above, the first rotation axis 6 is disposed so as to pass through the intersection of the beam irradiation axis of the FIB column 1 and the beam irradiation axis of the SEM column 2 and perpendicular to both the FIB column 1 and the SEM column 2. For the employment of this disposition, the first rotation axis 6 is mechanically fixed regarding the FIB column 1 and the SEM column 2.

When the sample 5 is actually placed on the sample stage, there is a difference in the size of the sample 5 or an error when the sample 5 is attached thereto, some form of positioning mechanism is required for accurate disposal at a location for processing and observing the sample 5 on the first rotation axis 6. As such a positioning mechanism, a movement mechanism 7 of which three axes substantially perpendicular to each other and which can perform movement motion is installed. One axis of the three axes substantially perpendicular to each other is disposed so as to be substantially parallel to the first rotation axis 6. Through this disposition, the remaining two axes respectively become substantially parallel to the FIB column 1 and the SEM column 2 when the first rotation axis 6 forms an appropriate angle.

Here, in order to dispose the sample 5 on the first rotation axis 6 using the above-described movement mechanism 7, there is a need for a supporting member 8 which fixes the movement mechanism 7 to a rotation stage 9, which works with the first rotation axis 6 as a single body, at a position separated by a certain distance corresponding to an expected size of the sample 5 and a size of the movement mechanism 7 itself. As such, details of the tilt mechanism for processing the sample 5 such that the surface thereof does not have a tapered shape have been described.

In the apparatus having the above-described configuration, the sample 5 is placed on a holder installed on the movement mechanism 7. The first rotation axis 6 is installed such that the surface of the sample 5 is substantially parallel to the FIB column 1 in a state where the three axes of the movement mechanism 7 substantially perpendicular to each other form a rotation angle such that the three axes are respectively substantially parallel to the first rotation axis 6, the FIB column 1, and the SEM column 2. In this state, the sample 5 is observed using both the FIB column 1 and the SEM column 2, and the sample 5 is disposed on the first rotation axis 6 by moving the movement mechanism 7 such that the place for processing and observing the sample 5 comes to the center of an image based on both the observed images.

After the sample 5 is disposed, the first rotation axis 6 is operated at an appropriate angle and thus the sample 5 is tilted. At this time, the tilt angle is different depending on the material of the sample 5, a beam current value of the focused ion beam 3 to be used, and the like, and, in many cases, is an angle within several degrees. If the sample 5 has been tilted, the sample 5 is processed using the FIB column 1 so as to become gradually thinner. During the process, the sample 5 is appropriately observed using the SEM column 2, and the process stops immediately before a desired structure is exposed to the sample surface. The steps hitherto are repeated after the sample 5 is turned over, and the formation of a lamella is finished. Therefore, it is possible to form a highly-sophisticated lamella sample having a uniform thickness and accurately including a fine structure of an observed object.

Second Embodiment

Figure 3:
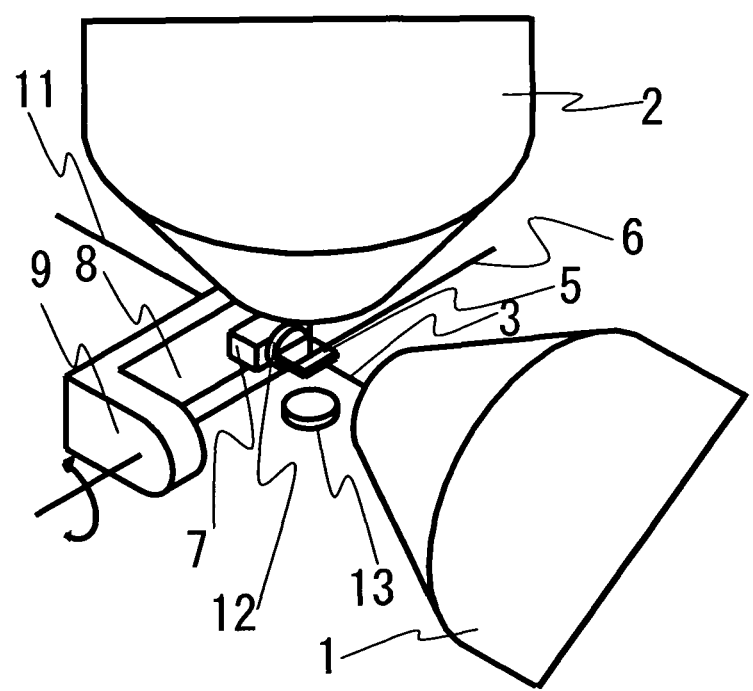
FIG. 3 is a diagram illustrating an apparatus configuration according to second and third embodiments of the present invention.

The second embodiment of the present invention will be described with reference to FIG. 3. The difference with the first embodiment lies in having a sample rotation mechanism 12 between the movement mechanism 7 and the sample 5. A second rotation axis 11 included in the sample rotation mechanism 12 is disposed so as to be parallel to one translation axis which can be substantially parallel to the FIB column 1 among the three axes of the movement mechanism 7 substantially perpendicular to each other.

By including the sample rotation mechanism 12, it is possible to adjust the orientation in the rotation direction inside the surface perpendicular to the focused ion beam 3. In addition, when the rear surface of the sample 5 is processed, the sample 5 can be easily turned over by rotating the second rotation axis 11 by 180 degrees. In addition, since the sample 5 can be rotated at a position where the electron beam 4 and the focused ion beam 3 are irradiated, it is possible to adjust the orientation of the sample 5 without missing the observed position.

In addition, the sample 5 may interfere with the SEM column 2 when rotated, depending on a size of the sample 5. In this case, the second rotation axis 11 is moved apart from the SEM column 2 using the movement mechanism 7, the sample 5 is turned over, and the sample 5 returns to the original position using the movement mechanism 7, thereby turning over the sample 5 without interfering with the SEM column 2.

Third Embodiment

The third embodiment of the present invention will be described with reference to FIG. 3. In a state where the supporting member 8 of the rotation stage 9 is positioned opposite to the FIB column 1 with the sample 5 interposed therebetween, the front surface of the sample 5 becomes substantially parallel to the FIB column 1, and thereby a space can remain at the rear surface side of the sample 5 when seen from the SEM column 2 during a normal operation. A transmitted electron detector 13 is disposed in this space, and thus it is possible to obtain a transmitted electron image as well as a secondary electron image as an observed image of the SEM column 2. Since the transmitted electron image includes information regarding the inside of the sample and the thickness of the sample 5, it is possible to obtain an image suitable to form a TEM lamella which appropriately and accurately includes an observed object and has a desired thickness.

By using the apparatus having the above-described configuration according to the embodiment of the present invention, it is possible to efficiently process a highly-sophisticated TEM lamella.

Fourth Embodiment

The fourth embodiment of the present invention will be described with reference to FIGS. 6 to 12. As shown in FIG.

6, the sample 5 is placed on a tilt stage 31 connected to the sample rotation mechanism 12. The tilt stage 31 can tilt the surface of the tilt stage 31 on which the sample 5 is placed using a tilt mechanism 32 connected to the tilt stage 31 so as to be substantially perpendicular to the electron beam 4 and the focused ion beam 3.

Figure 7A:
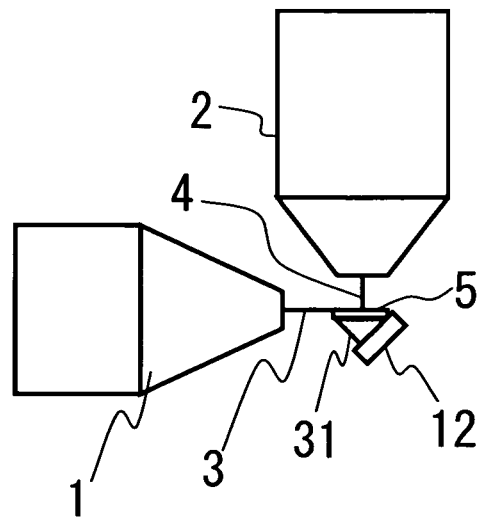
FIGS. 7A and 7B are diagrams illustrating apparatus configurations according to the fourth embodiment of the present invention.

FIG. 7A shows a tilted state where the second rotation axis 11 is disposed so as to intersect the electron beam 4 at an angle of 45 degrees using the rotation stage 9, and the surface of the sample 5 is substantially perpendicular to the electron beam 4 using the tilt stage 31. In other words, the tilt stage 31 is tilted to form a tilted angle of 45 degrees with respect to the sample rotation mechanism 12. In this state, the electron beam 4 can be irradiated so as to be substantially perpendicular to the surface of the sample 5, and thus a high resolution SEM observation for the surface can be made. In addition, the focused ion beam 3 can be irradiated so as to be substantially parallel to the surface, and thus an etching process for accurately removing the surface can be performed.

Figure 7B:
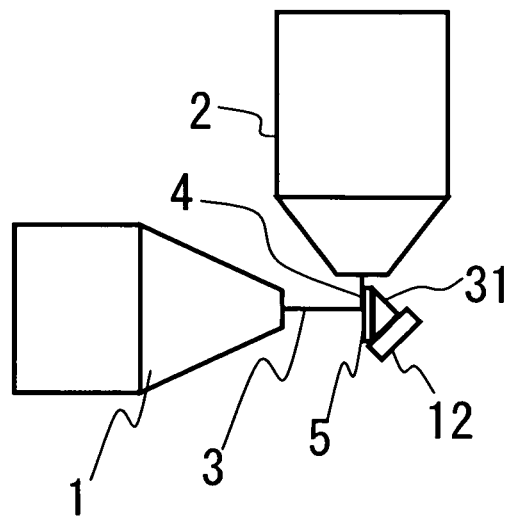

Next, the sample 5 and the tilt stage 31 are rotated by 180 degrees using the sample rotation mechanism 12, without driving the rotation stage 9 and the tilt stage 31 as they are. Thereby, as shown in FIG. 7B, the surface of the sample 5 can be disposed so as to be substantially parallel to the electron beam 4 and substantially perpendicular to the focused ion beam 3.

In this state, the focused ion beam 3 can be irradiated so as to be substantially perpendicular to the surface of the sample 5, and thus a cross-section substantially perpendicular to the surface can be formed through the etching process. In addition, the electron beam 4 is irradiated to the formed cross-section so as to be substantially perpendicular thereto, and a high resolution SEM observation for the cross-section can be made.

Also, since the orientation of the sample 5 can be adjusted through the rotation of the sample rotation mechanism 12, the electron beam 4 and the focused ion beam 3 are irradiated to the sample 5 during the rotation and observation can be made. Thereby, it is possible to adjust the orientation of the sample 5 without missing the observed position of the sample 5. Particularly, it is possible to accurately and easily adjust the surface of the sample 5 so as to be substantially perpendicular or substantially parallel to the electron beam 4 and the focused ion beam 3.

Figure 8:
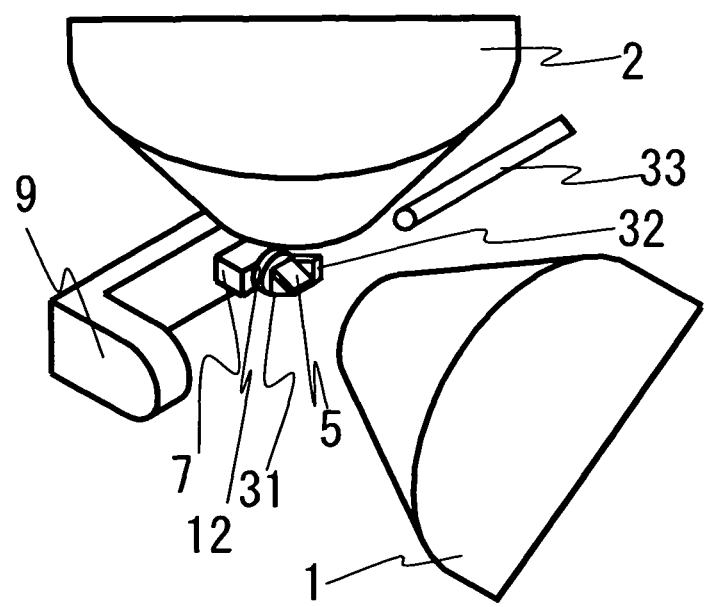
FIG. 8 is a diagram illustrating an apparatus configuration according to the fourth embodiment of the present invention.
Figure 9A:
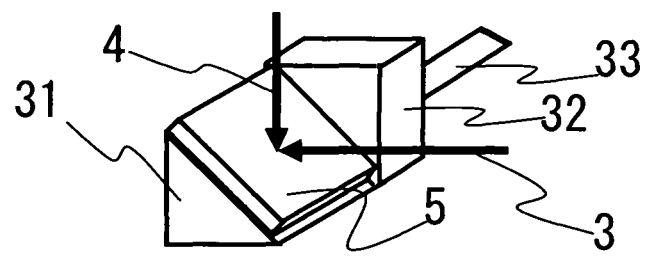
FIGS. 9A to 9C are diagrams illustrating apparatus configurations according to the fourth embodiment of the present invention.

Next, a tilt operation of the tilt stage 31 will be described with reference to FIGS. 8 to 9C. In order to tilt the tilt stage 31, as shown in FIG. 8, a tilt rod 33 is introduced into the sample chamber 20. The tilt rod 33 is connected to the tilt mechanism 32 and rotated, and the tilt stage 31 is tilted by driving the tilt mechanism 32. FIG. 9A is a diagram illustrating a state where the surface of the sample 5 intersects the electron beam 4 and the focused ion beam 3 at an angle of 45 degrees. In this state, the tilt rod 33 is rotated. Thereby, as shown in FIG. 9B, it is possible to change the orientation of the sample 5 such that the surface of the sample 5 intersects the electron beam 4 so as to be substantially perpendicular thereto and intersects the focused ion beam 3 so as to be substantially parallel thereto.

Figure 9B:
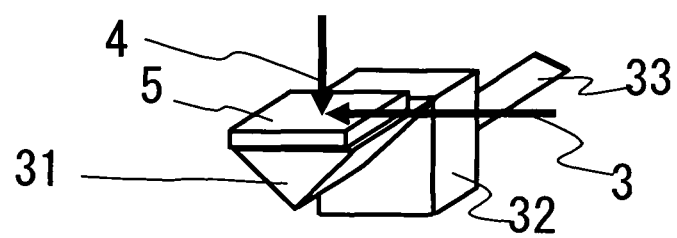
Figure 9C:
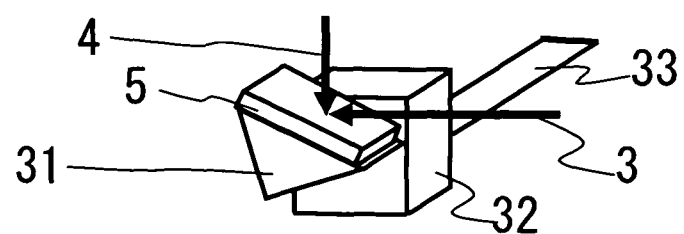

In addition, as shown in FIG. 9C, the tilt stage 31 can be positioned between the states shown in FIGS. 9A and 9B. In addition, it is possible to adjust the surface of the sample 5 so as to have an angle of 45 to 90 degrees with respect to the electron beam 4. Here, although the example where the adjustment of the tilt stage 31 is performed in the sample chamber 20 has been described, the tilt stage 31 may be positioned outside the sample chamber 20, and the tilt stage 31 may be tilted.

Figure 10A:
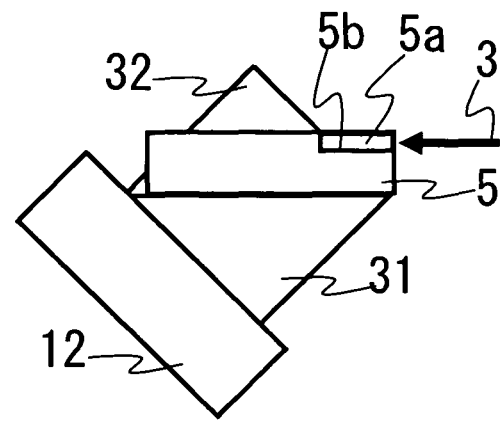
FIGS. 10A to 10B are diagrams illustrating a sample process according to the fourth embodiment of the present invention.

Next, a sample processing and observing method using the sample rotation mechanism 12 and the tilt stage 31 will be described. FIG. 10A shows a tilted state where the second rotation axis 11 is disposed so as to intersect the electron beam 4 at an angle of 45 degrees using the rotation stage 9, and the surface of the sample 5 is substantially perpendicular to the electron beam 4 using the tilt stage 31. In this state, the focused ion beam 3 is irradiated to the surface of the sample 5 in a direction of substantially parallel thereto, a portion of the surface of the sample 5 is etched, and a processed groove 5a is formed. A cross-section 5b is formed on the side wall of the processed groove 5a through this process.

Figure 10B:
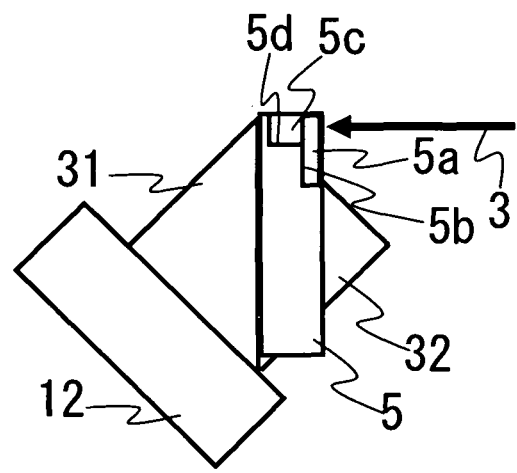

Next, the sample rotation mechanism 12 is rotated by 180 degrees, and the sample 5 is disposed such that the focused ion beam 3 is irradiated to the cross-section 5b so as to be substantially perpendicular thereto as shown in FIG. 10B. The focused ion beam 3 is irradiated to a portion of the cross-section 5b to form a processed groove 5c. Thereby, it is possible to form a cross-section 5d which follows the cross-section 5b and is substantially perpendicular to the cross-section 5b. Therefore, it is possible to form a cross-section at a desired position inside the sample 5 with high accuracy.

It is known that if a cross-section is formed by irradiating the focused ion beam to a rough surface, roughness is generated in the cross-section. The cross-section 5d is formed by irradiating the focused ion beam 3 to the cross-section 5b side which has been formed using the focused ion beam 3, and thus becomes even without being influenced by the roughness of the surface. Therefore, it is possible to observe an observed object with high accuracy having no roughness in cross-section.

Figure 11A:
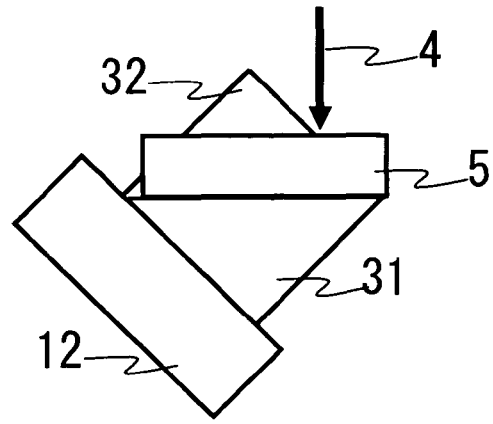
FIGS. 11A to 11C are diagrams illustrating a sample process according to the fourth embodiment of the present invention.

Next, a method of forming a TEM sample using the sample rotation mechanism 12 and the tilt stage 31 will be described. FIG. 11A shows a tilted state where the second rotation axis 11 is disposed so as to intersect the electron beam 4 at an angle of 45 degrees using the rotation stage 9, and the surface of the sample 5 is substantially perpendicular to the electron beam 4 using the tilt stage 31. In this state, the electron beam 4 is irradiated to the surface of the sample 5, and the position of an observed object is confirmed using the TEM through the high resolution SEM observation.

Figure 11B:
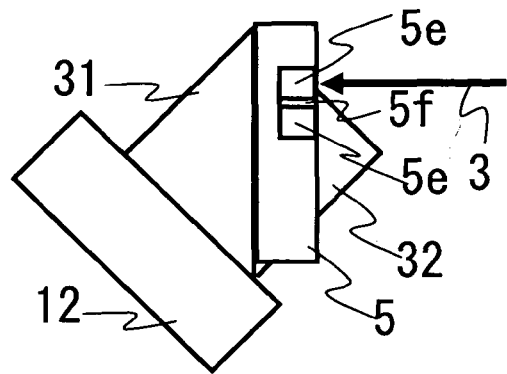
Figure 11C:
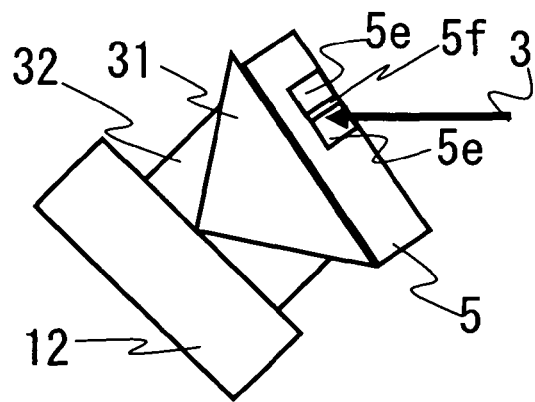

In addition, the sample rotation mechanism 12 is rotated by 180 degrees, and the sample 5 is disposed such that the focused ion beam 3 is irradiated to the cross-section 5b so as to be substantially perpendicular thereto as shown in FIG. 11B. The focused ion beam 3 is irradiated to a portion of the cross-section 5b to form a processed groove 5c. Also, the focused ion beam 3 is irradiated to form a processed groove 5e such that a lamella 5f remains.

The tilt stage 31 is tilted using the tilt mechanism 32, and the lamella 5f is separated from the sample 5 by irradiating the focused ion beam 3 to a connection portion of the lamella 5f and the sample 5. Thereby, since the orientation with respect to the focused ion beam 3 can be adjusted and the process can be performed while the lamella 5f is observed using the focused ion beam 3, even a fine TEM observed object can be processed with high accuracy without missing.

In addition, although the example where the sample rotation mechanism 12 is installed such that the second rotation axis 11 intersects the electron beam 4 at an angle of 45 degrees using the rotation stage 9, the setting angle between the sample rotation mechanism 12 and the tilt stage 31 is not limited thereto. Other examples will be described with reference to FIG. 12.

Figure 12A:
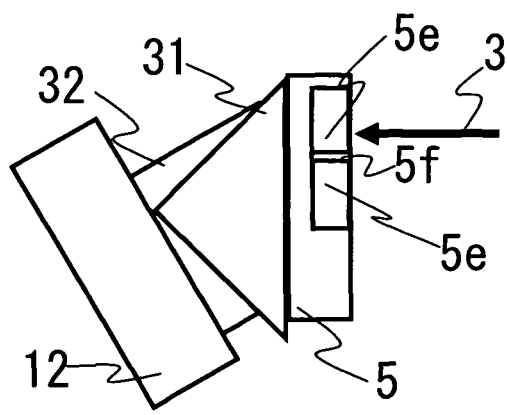
FIGS. 12A and 12B are diagrams illustrating a sample process according to the fourth embodiment of the present invention.

FIG. 12A shows a tilted state where the second rotation axis 11 is disposed so as to intersect the electron beam 4 at an angle of 60 degrees, that is, so as to intersect the focused ion beam 3 at an angle of 30 degrees, using the rotation stage 9, and the surface of the sample 5 is substantially perpendicular to the focused ion beam 3 using the tilt stage 31. The tilt stage 31 is tilted at an angle of 30 degrees with respect to the sample rotation mechanism 12. In this state, the focused ion beam 3 is irradiated to form a processed groove 5e such that a lamella 5f remains.

Figure 12B:
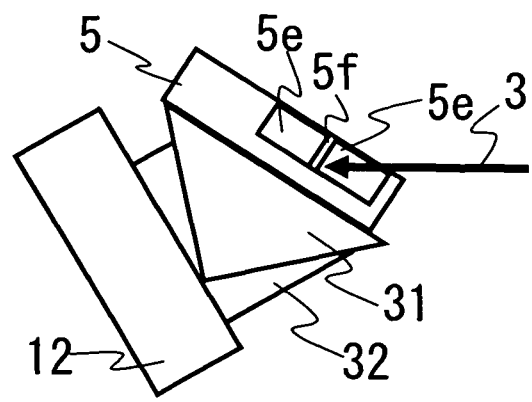

Also, the sample rotation mechanism 12 is rotated by 180 degrees. As shown in FIG. 12B, the second rotation axis 11 has an angle of 60 degrees with respect to the electron beam 4, and the normal direction of the surface of the sample 5 placed on the tilt stage 31 has an angle of 60 degrees with respect to the focused ion beam 3. Here, the lamella 5f is separated from the sample 5 by irradiating the focused ion beam 3 to a connection portion of the lamella 5f and the sample 5. Thereby, the lamella can be cut by rotating the sample rotation mechanism 12 by 180 degrees. In other words, the lamella 5f can be cut without the rotation of the rotation stage 9, and thus it is possible to perform the process with good accuracy by reducing a position misalignment according to a sample movement.

Fifth Embodiment

The fifth embodiment of the present invention will be described with reference to FIGS. 13A and 13B.

The SEM column 2 is installed vertically. The FIB column 1 is installed to have an angle of 60 degrees with respect to the SEM column 2. Further, the tilt stage 31 is connected to the sample rotation mechanism 12. Due to this configuration, the electron beam can be irradiated to an observed surface so as to be substantially perpendicular thereto, and thereby it is possible to improve capability in SEM observation or STEM observation and to efficiently control disposition and orientation of a sample.

Figure 13A:
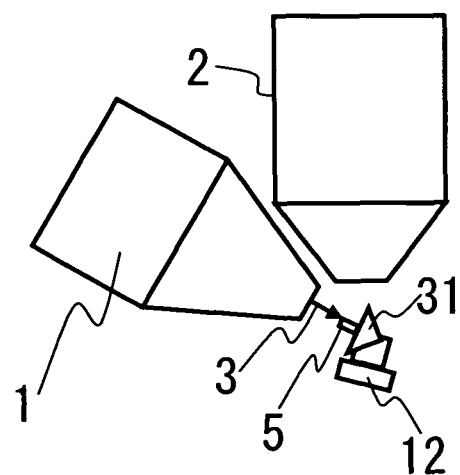
FIGS. 13A and 13B are diagrams illustrating an apparatus configuration according to the fifth embodiment of the present invention.
Figure 13B:
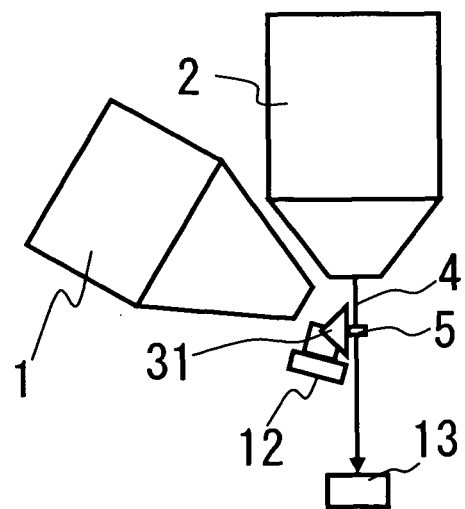

FIG. 13A shows a tilted state where the second rotation axis 11 is disposed so as to intersect the electron beam 4 at an angle of 30 degrees using the rotation stage 9, and an observed surface of the sample 5 is substantially parallel to the focused ion beam 3 using the tilt stage 31. In other words, the tilt stage 31 is tilted at an angle of 120 degrees with respect to the sample rotation mechanism 12. In this state, the focused ion beam 3 is irradiated, and the etching process can be performed so as to remove the surface layer of the observed surface.

Next, the sample 5 and the tilt stage 31 are rotated by 180 degrees using the sample rotation mechanism 12, without driving the rotation stage 9 and the tilt stage 31 as they are. Thereby, as shown in FIG. 13B, the observed surface of the sample 5 can be disposed so as to be substantially perpendicular to the electron beam 4. In this state, it is possible to perform the high resolution SEM observation for the observed surface by irradiating the electron beam 4 to the observed surface or to perform the high resolution STEM observation by detecting transmitted electrons using the transmitted electron detector 13. In this way, simply by rotating the sample rotation mechanism 12, it is possible to change the sample 5 from the disposition for processing the observed surface to the disposition for observing the observed surface.

By using the apparatus having the above-described configuration, the electron beam can be irradiated to an observed surface so as to be substantially perpendicular thereto, and thereby it is possible to improve capability in SEM observation or STEM observation and to efficiently control disposition and orientation of a sample.

What is claimed is:

1. A composite charged particle beam apparatus comprising:
    a focused ion beam column;
    a scanning electron microscope; and
    a rotatable stage,
    wherein a beam irradiation axis of the focused ion beam column and a beam irradiation axis of the scanning electron microscope intersect each other so as to be substantially perpendicular to each other,
    wherein the rotatable stage is provided with a supporting member having a rotation axis which intersects the beam irradiation axis of the focused ion beam column and the beam irradiation axis of the scanning electron microscope so as to be substantially perpendicular thereto, respectively, at a sample observing position, and
    wherein the supporting member is connected to a movement mechanism configured to move the sample relative to the supporting member to the sample observing position.

2. The composite charged particle beam apparatus according to claim 1, wherein the movement mechanism has three driving axes which are substantially perpendicular to each other, and
    wherein one of the driving axes is disposed in a direction which is substantially parallel to the beam irradiation axis of the focused ion beam column by rotation of the supporting member.

3. The composite charged particle beam apparatus according to claim 2, wherein the movement mechanism includes a sample rotation mechanism having a rotation axis substantially perpendicular to the rotation axis of the rotatable stage.

4. The composite charged particle beam apparatus according to claim 3, further comprising a tilt stage that is connected to the sample rotation mechanism and configured to tilt a surface of the sample to a disposition where the surface of the sample is substantially perpendicular to the beam irradiation axis of the scanning electron microscope and to a disposition where the surface of the sample is substantially perpendicular to the beam irradiation axis of the focused ion beam column.

5. The composite charged particle beam apparatus according to claim 4, wherein the tilt stage has a tilt mechanism which tilts the tilt stage inside the apparatus.

6. The composite charged particle beam apparatus according to claim 5, further comprising a tilt rod connected to the tilt mechanism for rotating the tilt mechanism to tilt the tilt stage.

7. The composite charged particle beam apparatus according to claim 3, further comprising a tilt stage that is connected to the sample rotation mechanism for tilting a surface of the sample so as to be substantially perpendicular to the beam irradiation axis of the focused ion beam column and the beam irradiation axis of the scanning electron microscope, respectively.

8. The composite charged particle beam apparatus according to claim 7, wherein the sample rotation mechanism rotates the surface of the sample fixed to the tilt stage so as to be substantially perpendicular to the beam irradiation axis of the focused ion beam column and the beam irradiation axis of the scanning electron microscope, respectively.

9. The composite charged particle beam apparatus according to claim 1, further comprising a transmitted electron detector which detects transmitted electrons while the scanning electron microscope irradiates the sample with an electron beam.

10. A composite charged particle beam apparatus comprising:
- a focused ion beam column;
- a scanning electron microscope; and
- a rotatable stage,
- wherein the rotatable stage is provided with a supporting member having a rotation axis which intersects the beam irradiation axis of the focused ion beam column and the beam irradiation axis of the scanning electron microscope so as to be substantially perpendicular thereto, respectively, at a sample observing position,
- wherein the supporting member is connected to a movement mechanism which disposes the sample at the sample observing position,
- wherein the movement mechanism includes a sample rotation mechanism having a rotation axis substantially perpendicular to the rotation axis of the rotatable stage,
- wherein the sample rotation mechanism is connected to a tilt stage which tilts a surface of the sample so as to be substantially perpendicular to the beam irradiation axis of the scanning electron microscope, and
- wherein the tilt stage is connected to a tilt mechanism configured to tilt the tilt stage.

11. The composite charged particle beam apparatus according to claim 10, further comprising a tilt rod connected to the tilt mechanism for rotating the tilt mechanism to tilt the tilt stage.

* * * * *